Sept. 29, 1970 H. S REICHARD 3,531,729

TRANSISTOR AMPLIFIER WITH CONTROLLED TEMPERATURE-DEPENDENT GAIN

Filed Jan. 25, 1967 2 Sheets-Sheet 1

AMPLIFIER GAIN vs. TEMPERATURE (°C)

INVENTOR
H. S. REICHARD
BY Marn & Jangarathis
ATTORNEYS

United States Patent Office 3,531,729
Patented Sept. 29, 1970

3,531,729

TRANSISTOR AMPLIFIER WITH CONTROLLED TEMPERATURE-DEPENDENT GAIN

Harry S. Reichard, Princeton Junction, N.J., assignor to Princeton Applied Research Corporation, Princeton, N.J.

Filed Jan. 25, 1967, Ser. No. 611,689
Int. Cl. H03f *1/32, 3/04*
U.S. Cl. 330—23 1 Claim

ABSTRACT OF THE DISCLOSURE

The method of providing controlled temperature-dependent gain, and temperature stable gain, in a junction transistor amplifier by biasing the transistor amplifier such that the temperature dependence of the transistor's own base-emitter voltage and base current will provide a predetermined variation in emitter current which will in turn provide a forward transadmittance which is within desirable operating limits, and substantially independent of temperature, or predetermined function of temperature.

Figure 1:
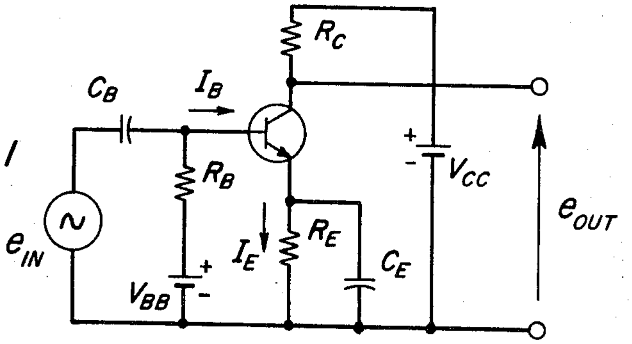

This invention relates generally to transistor amplifiers having controlled temperature-dependent gain, and more particularly, to junction transistor amplifiers having temperature stable gain.

Such transistor amplifiers, assuming a relatively low source impedance, typically exhibit a negative temperature coefficient of voltage gain of approximately —0.3% per degree Celsius, around room temperature (vicinity of 300° K.), when connected in the common-emitter configuration.

Various methods known to the prior art have been used to reduce such gain-temperature dependance of transistor amplifiers. Among these methods are the following:

(1) Negative feedback.

(2) Degeneration (actually merely another word applied to some special cases of negative feedback).

(3) The placing of the amplifier in an enclosure maintained at constant temperature.

(4) The method of inserting a suitable input impedance in series with the input signal, such that the positive temperature coefficient of the input impedance substantially compensates for the negative temperature coefficient of voltage gain.

There are, however, disadvantages to each of these methods, some more serious than others. At very high frequencies (above 100 mHz., for example (feedback around more than one stage of amplification is difficult due to the phase shifts inherent in transistors. While degeneration of a single stage may be practical at high frequencies, such method of achieving temperature stable gain is not always possible, since usually the available gain is only slightly more than the desired gain, hence, the amount of degeneration that can be used is severely limited. In addition, it is frequently impossible to arrange for negative feedback or degeneration without causing a significant worsening of the noise factor. The method of (4) above reduces the available gain and worsens the noise factor as well. Finally, even in those instances when negative feedback or degeneration can be used, there may be need for improving the gain stability of the basic, open-loop amplifier stage, and by so doing, achieving an improved gain stability in the closed-loop amplifier. The method of placing the amplifier in a constant temperature enclosure has the obvious disadvantages of cost, complexity, and inconvenience.

The phenomenon or effect which usually dominates the gain-temperature dependence therefor of a junction transistor amplifier, is the temperature dependent incremental emitter resistance, and the consequent temperature dependent common-emitter "forward transadmittance" ($y_{fe}$), of the transistor.

The common-emitter forward transadmittance $y_{fe}$, as is known in the art, is defined as the incremental change in collector current divided by the incremental change in base-emitter voltage causing said change of collector current, with the collector-emitter voltage held constant. For more details, refer to John N. Shive, The Properties, Physics, and Design of Semiconductor Devices, Van Nostrand, Princeton, N.J. (1959), p. 205.

It has been found that, under normal operating conditions, and with the transistor biased for constant emitter current and constant collector-base voltage, $y_{fe}$ will exhibit a temperature coefficient of approximately —0.3% per degree Celsius around room temperature. Further, it has been found, that in the simple common-emitter transistor amplifier, driven from a low impedance source and biased for constant emitter current, the voltage gain will consequently exhibit a temperature coefficient of approximately —0.3% per degree Celsius.

The transistor forward transadmittance, $y_{fe}$, is also a function of the DC emitter current, $I_E$, and is in fact (approximately) proportional to the emitter current over a limited range of emitter currents. Therefore, it has been found that if a transistor amplifier circuit is arranged such that the emitter current $I_E$ varies with temperature, it is possible to achieve gain temperature coefficients other than —0.3% per degree Celsius. More specifically, it has been found that if the emitter current $I_E$ is made a positive function of temperature of approximately +0.3% per degree Celsius, the gain temperature dependence should well be substantially zero over a predetermined temperature range.

It is the primary object of the present invention to provide a transistor amplifier having controlled temperature-dependent gain.

It is another object of the present invention to provide a transistor amplifier in which the DC emitter current is made to vary with temperature in a predetermined manner, such that the gain of the transistor amplifier is a predetermined function of temperature, such as for example, independent of the temperature.

It has been found, however, that it is possible to utilize temperature dependent parameters of the transistor itself to provide the desired DC emitter current-temperature relationship over a predetermined temperature range. It has been further found that there are at least two effects or temperature-dependent parameters in the junction transistor which can be utilized to achieve the desired temperature dependent emitter current. More specifically, it has been found that:

(1) The base-emitter voltage of a junction transistor (operating at constant emitter current and constant collector-base voltage) will show a temperature coefficient of about —2.5 mv. per degree Celsius. Or, if the transistor is biased for constant base-emitter voltage and constant collector-base voltage, the emitter current will show a temperature coefficient of the order of +10% per degree Celsius; and (2) The base current of a junction transistor (operating at constant emitter current and constant collector-base voltage) will in general decrease with increasing temperature. For silicon transistor operated at current levels such that the $I_{CBO}$ (collector-base leakage) component of base current is much less than the $I_C/h_{FE}$ component, the temperature coefficient of base current will be of the order of —0.6% per degree Celsius. If the transistor base is fed from a current source, or from a nonzero resistive source, a positive temperature coefficient of emitter current will result.

A transistor amplifier having temperature stable gain, according to the present invention, can utilize either or both of these effects to produce an emitter current which varies proportionally with temperature, thereby achieving $y_{fe}$ independent of temperature.

Figure 2:
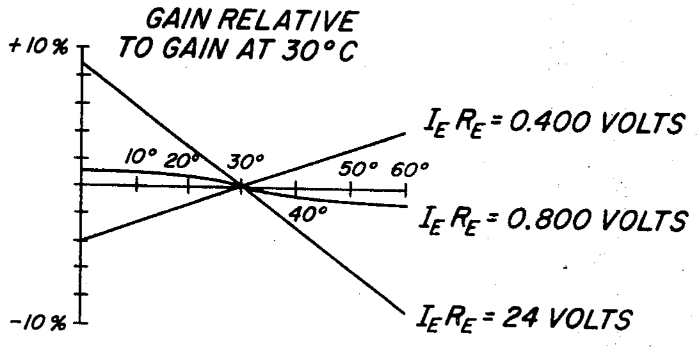
Figure 3:
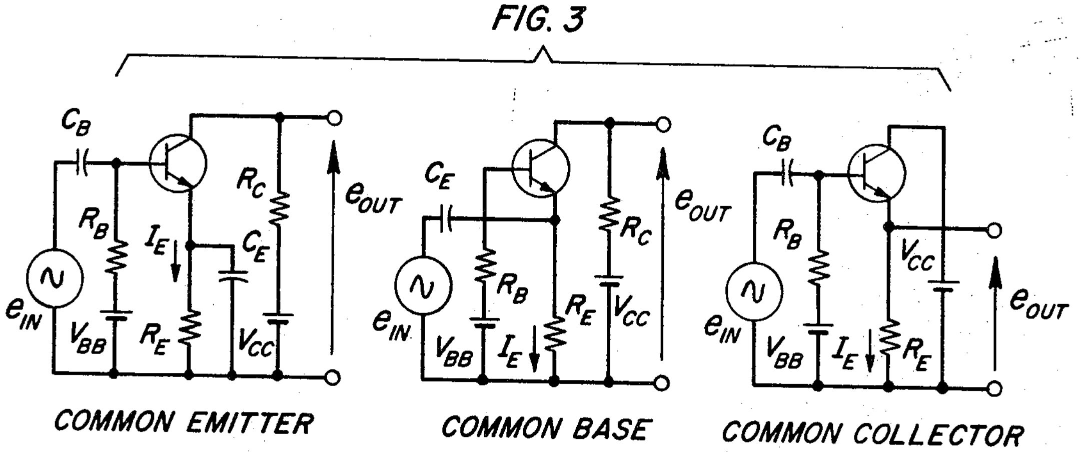
Figure 4:
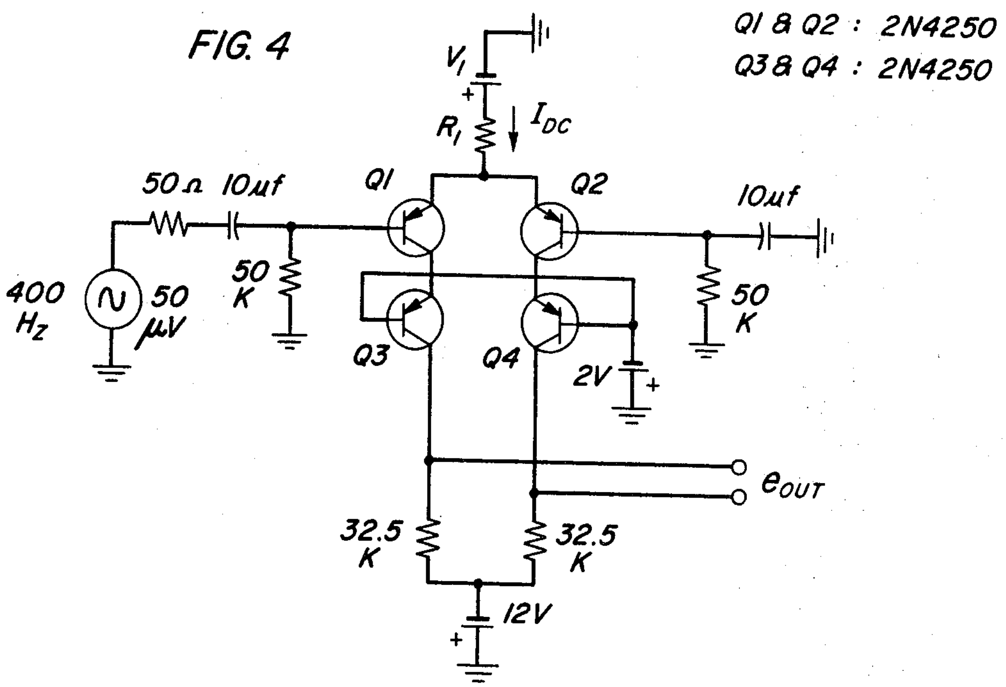
Figure 5:
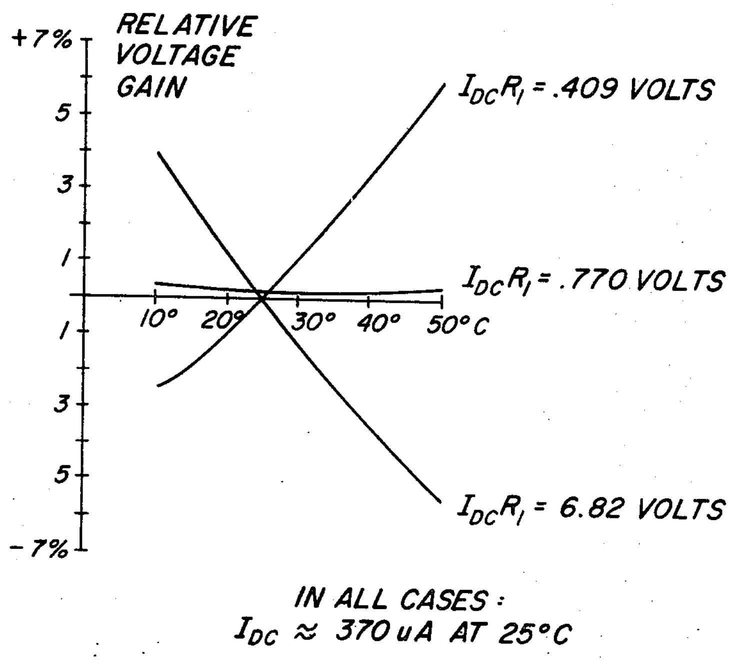

Referring now to the figures shown in the attached drawing:

FIG. 1 shows a simple common-emitter transistor amplifier useful in teaching the method of the present invention;

FIG. 2 is a graph showing a family of curves of amplifier gain vs. temperature for several choices of DC voltage emitter bias; and FIG. 3 shows basic transistor amplifier configurations, to which, inter alia, the present invention is applicable, FIG. 4 shows a specific embodiment of the present invention as practiced in a differential cascode amplifier; and FIG. 5 is a graph of data plotted from the circuit of FIG. 4.

Referring now to FIG. 1 wherein there is shown a simple junction transistor amplifier of the common-emitter configuration. Under certain simplifying assumptions, the voltage gain, of this amplifier can be shown to be approximately:

$$\frac{e_{\text{out}}}{e_{\text{in}}}=R_C\frac{\alpha I_E}{KT} \quad (1)$$

where:

$\alpha$ is the electronic charge, $1.60\times10^{-19}$ coulombs.
K is the Boltzmann constant, $1.38\times10^{-23}$ joules/° K.
T is the temperature in degrees Kelvin.

From Equation 1, it is apparent that the voltage gain, under these simplifying assumptions and with a constant emitter current $I_E$, will vary inversely with temperature, and that in the range of ambients around 300° K., will exhibit a temperature coefficient of about −0.3% per Kelvin degree. This behavior is well known and commonly observed in actual amplifiers of this type.

Equation 1 also shows that if $I_E$ is made proportional to the absolute temperature, (° K.), the voltage gain will become independent of temperature. The following derivation will show that it is possible to choose $V_{BB}$, $R_B$, and $R_E$ in such a way as to cause the desired variation of $I_E$ with temperature. From FIG. 1, it can be seen that $$V_{BB}-I_BR_B-V_{BE}=I_ER_E \quad (2)$$

Assume that $V_{BB}$, $R_B$, and $R_E$ are temperature-independent, but that $I_B$, $I_B$, and $V_{BE}$ vary with temperature as they will in any actual transistor. Thus, $$R_E\frac{dI_E}{dT}=-\frac{dV_{BE}}{dT}R_B\frac{dI_B}{dT} \quad (3)$$

and $$\frac{dI_E/dT}{I_E}=\frac{-1}{I_ER_E}\left[\frac{dV_{BE}}{dt}+I_BR_B\frac{dI_B/dT}{I_B}\right] \quad (4)$$

As is known by those skilled in the art, for typical junction transistors, $dV_{BE}/dT$ is about $-2.5\times10^{-3}$ volts per degree Kelvin around 300° K. (see, for example, "Handbook of Semiconductor Electroncis," pp. 11–17, second edition, McGraw-Hill, edited by L. P. Hunter); and $$\frac{dI_B/dT}{I_B}$$

is approximately $-6\times10^{-3}$ per degree Kelvin, around 300° K.

It can be seen from Equation 1 that the condition for the voltage gain to be independent of temperature is $$\frac{dI_E/dT}{I_E}=\frac{T}{1} \quad (5)$$

Combining Equations 4 and 5 gives $$\frac{1}{T}=\frac{-1}{I_ER_E}\left[\frac{dV_{BE}}{dT}+I_BR_B\frac{dI_B/dt}{I_B}\right] \quad (6)$$

as the criterion for achieving a zero temperature coefficient of voltage gain at any given temperature.

It will be further assumed that $I_BR_B$ is less than 40 mv. (a condition frequently encountered in actual practice), hence, the second term within the brackets, Equation 6, becomes approximately 240 $\mu$v. per degree Kelvin—or, less than one-tenth of the first term. Under this assumption, $$I_ER_E\cong T\frac{dV_{BE}}{dt}=0.750\text{ volt} \quad (7)$$

at $T=300°$ K.

It will be understood by those skilled in the art, that while a number of simplifying assumptions have been made in the derivation of Equation 7, the significance of the result remains, viz, it is possible to bias a junction transistor amplifier such that the temperature dependence of the transistor's own base-emitter voltage and base current will cause the proper emitter-current vs. temperature relation so as to provide a forward-transadmittance mon transistor amplifier configuration, viz, the common-base and common collector.

While the above derivation indicates that the proper operating point is a voltage drop across the emitter resistance of approximately 0.750 volt, the usual procedure would be to find the proper voltage empirically by plotting gain-vs.-temperature for several choices of this parameter. A family of such curves is shown in FIG. 2.

Further, it will be appreciated by those skilled in the art, that while the above set forth method of providing temperature stable gain was directed to the common-emitter transistor amplifier configuration, such method is also applicable, inter alia, to the other two most common transistor amplifier configurations, viz, the common-base and common-collector.

However, it will be further understood that such is not to state that the appropriate biasing for the common-base and common-collector circuits will be necessarily exactly the same as for the common-emitter configuration, but rather that it is possible to bias each such configuration for gain-temperature independent (always assuming a low source impedance relative to the input impedance of the circuit under consideration), that the condition for gain independent of temperature can be found in accordance with the foregoing teaching for each confiuration, and that the condition will be characterized by a DC voltage drop across the emitter resistance of approximately 0.750 volt. FIG. 4 shows the three most common transistor amplifier configurations, and for all three, the condition of voltage gain independent of temperature is given by an $I_ER_E=0.750$ volt.

The teaching of the present invention is applicable to both NPN and PNP type junction transistors, made of any semiconductor material (i.e., silicon, germanium, etc.). The criteria for biasing will be different for different devices, but the underlying method will be the same.

FIG. 4 shows a specific embodiment of the present invention, as applied to a differential cascode amplifier. FIG. 5 is a plot of data obtained from this circuit, showing relative voltage gain as a function of temperature, with the DC voltage drop across R1 as a parameter. With a large drop (6.82 volts) across R1, the $I_{DC}$ is substantially independent of temperature, and the voltage gain of the stage decreases with increasing temperature. With the voltage drop across R1 relatively low (0.409 volts), $I_{DC}$ increases rapidly with temperature, resulting in a voltage gain which increases with temperature. The optimum choice for the voltage drop across R1 for this embodiment is 0.770 volt, in which case $I_{DC}$ increases with temperature at the appropriate rate necessary to provide a voltage gain which is substantially independent of temperature between 10° C. and 50° C.

While the foregoing describes the invention in terms of stabilizing the gain of a common-emitter amplifier fed from a low impedance source by utilizing the transistor's own temperature-dependent DC parameters, it will be understood by those skilled in the art that:

(1) The method can be used to provide a gain which is a predetermined function of temperature, rather than substantially independent of temperature;

(2) The method can be utilized with all of the possible connections of the junction transistor (common-base, common-emitter, and common-collector); and, (3) The method can be utilized with non-zero as well as zero source impedances. For example, assume that a common-emitter amplifier is constructed to have a variation of emitter current with temperature such that the gain is substantially independent of temperature when fed from a zero impedance source. This same amplifier, when fed from a non-zero source impedance, will exhibit a gain which increases with increasing temperature, because of the positive temperature coefficient of input impedance. In such an instance, and in keeping with the scope of the present invention, the magnitude of the variation of emitter current with temperature must be reduced; in the simple common-emitter amplifier described above, this would be accomplished by increasing the voltage drop across $R_E$.

Repeating briefly, the gist of the invention is provided by varying the DC emitter current with temperature in a predetermined manner such that the amplifier gain is a predetermined function of temperature. A specific case of a predetermined function of temperature is that in which the gain is made to be substantially independent of temperature.

It will be further understood by those skilled in the art, that only the AC small-signal voltage gain is made temperature-independent, and that the input impedance, for example, may not be temperature-independent. Additionally, it will be understood that the transistor amplifier circuits of the present invention must be constructed so as to be tolerant of the relatively large temperature-dependent DC shifts which are a necessary part of the present invention.

It will be further understood that many modifications can be made in the present invention without departing from the spirit and scope thereof.

What is claimed is:

1. In a transistor amplifying circuit including junction transistor means connected in a common-emitter amplifying configuration, the method of providing temperature stable voltage gain at ambient temperatures in the vicinity of 300° K., said method comprising the steps of:

determining the variation in the gain characteristic of said transistor circuit as a function of temperature; and biasing said transistor circuit by establishing a DC base supply voltage ($V_{BB}$) and providing base resistance ($R_B$) and emitter resistance ($R_E$) to produce a DC voltage drop ($I_ER_E$) across the emitter resistance ($R_E$) of approximately 0.750 volt such that the variation with temperature of the DC base current and the DC base-emitter voltage of said transistor circuit will provide a predetermined variation in the DC emitter current ($I_E$) so that said gain characteristic of said transistor circuit with temperature approaches a constant thereby rendering the gain of said transistor circuit substantially independent of temperature.

References Cited

UNITED STATES PATENTS

| | | | |
|---|---|---|---|
| 3,346,817 | 10/1967 | Walker et al. | 330—23 |
| 3,370,244 | 2/1968 | Higgenbotham | 330—23 |

NATHAN KAUFMAN, Primary Examiner

U.S. Cl. X.R.

330—32